US009466682B2

United States Patent
Kwak

(10) Patent No.: US 9,466,682 B2
(45) Date of Patent: Oct. 11, 2016

(54) THIN FILM TRANSISTOR ARRAY PANEL

(71) Applicant: Samsung Display Co., Ltd., Yongin, Gyeonggi-Do (KR)

(72) Inventor: Yun Hee Kwak, Hwaseong-si (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/741,042

(22) Filed: Jun. 16, 2015

(65) Prior Publication Data

US 2016/0099327 A1    Apr. 7, 2016

(30) Foreign Application Priority Data

Oct. 1, 2014    (KR) .................. 10-2014-0132356

(51) Int. Cl.
| | |
|---|---|
| H01L 27/00 | (2006.01) |
| H01L 29/00 | (2006.01) |
| H01L 29/423 | (2006.01) |
| H01L 27/12 | (2006.01) |
| H01L 29/417 | (2006.01) |

(52) U.S. Cl.
CPC ..... *H01L 29/42384* (2013.01); *H01L 27/1222* (2013.01); *H01L 29/41733* (2013.01)

(58) Field of Classification Search
CPC . H01L 27/1222; H01L 27/12; H01L 27/156; H01L 27/3262; H01L 29/42384; H01L 29/41733; H01L 29/41731
See application file for complete search history.

(56) References Cited

U.S. PATENT DOCUMENTS

| | | | |
|---|---|---|---|
| 6,140,687 A * | 10/2000 | Shimomura | H01L 23/4824 257/390 |
| 7,268,839 B2 * | 9/2007 | Cho | G02F 1/1368 257/59 |
| 2006/0102897 A1 | 5/2006 | Suh et al. | |
| 2014/0078456 A1 | 3/2014 | Du et al. | |
| 2016/0013213 A1 * | 1/2016 | Ishizaki | H01L 29/41733 257/59 |

FOREIGN PATENT DOCUMENTS

| | | |
|---|---|---|
| KR | 10-0603397 B1 | 7/2006 |
| KR | 10-2008-0002186 A | 1/2008 |
| KR | 10-2008-0008550 A | 1/2008 |

\* cited by examiner

*Primary Examiner* — Nikolay Yushin
(74) *Attorney, Agent, or Firm* — Robert E. Bushnell, Esq.

(57) ABSTRACT

A thin film transistor array panel is capable of increasing an aperture ratio and decreasing parasitic capacitance between a gate electrode and a drain electrode by reducing an area of a thin film transistor. The thin film transistor array panel includes: a substrate; a gate line disposed on the substrate and including a gate electrode; a gate insulating layer on the gate line; a semiconductive island on the gate insulating layer; a circular drain electrode on the semiconductive island; and a source electrode disposed on the semiconductive island and shaped like a circular band bent in a direction from which the drain electrode is disposed. The gate electrode may include a circular portion that is overlapped by the drain electrode and a circular sector portion that is overlapped by the source electrode.

20 Claims, 9 Drawing Sheets

THIN FILM TRANSISTOR ARRAY PANEL

CLAIM OF PRIORITY

This application makes reference to, incorporates the same herein, and claims all benefits accruing under 35 U.S.C. §119 from an application earlier filed in the Korean Intellectual Property Office on the Oct. 1, 2014 and there duly assigned Serial No. 10-2014-0132356.

BACKGROUND OF THE INVENTION

1. Field of the Invention

Embodiments of the inventive concept relate to a thin film transistor array panel capable of increasing an aperture ratio and decreasing parasitic capacitance between a gate electrode and a drain electrode by reducing an area of a thin film transistor.

2. Description of the Related Art

A liquid crystal display (LCD) includes a liquid crystal layer interposed between two transparent substrates and drives the liquid crystal layer so as to adjust transmittance for each pixel, and thus a desired color can be displayed.

An LCD uses a variety of display modes in accordance with molecular arrangements in liquid crystals, and twisted nematic (TN) patterned vertical alignment (PVA), and electrically controlled birefringence (ECB) modes are often utilized because of advantages thereof in process. TN, PVA, and ECB LCDs are a vertical alignment (VA) mode in which liquid crystal molecules aligned parallel to a substrate shift to be aligned substantially perpendicular to the substrate when voltage is applied. Therefore, twisted nematic (TN), patterned vertical alignment (PVA) and electrically controlled birefringence (ECB) LCDs have disadvantageously a smaller viewing angle due to refractive index anisotropy of liquid crystal molecules when voltage is applied.

In order to overcome the disadvantage, LCDs in in-plane switching (IPS) and plane to line switching (PLS) modes have recently been developed.

A plane to line switching (PLS) mode LCD includes a first electrode and a second electrode with an insulating layer interposed therebetween in each pixel area and generates a fringe field so that all liquid crystal molecules between upper and lower substrates can move in each pixel area, thereby generating horizontal and vertical electric fields and improving an aperture ratio and transmittance.

A drain electrode of a thin film transistor is disposed in such a manner that a region where the drain electrode overlaps a gate electrode is different from a region where the drain electrode is in contact with a first electrode. In the plane to line switching (PLS) mode LCD, the insulating layer is further included to insulate the second electrode from the first electrode such that a contact hole through which the drain electrode is exposed has a larger area. As the contact hole through which the drain electrode is exposed becomes larger, the drain electrode also has an increasing area, which results in a lower aperture ratio.

Meanwhile, gate and source/drain parasitic capacitance (Cgs) occurring in an overlapping region of source and drain electrodes of a thin film transistor and a gate electrode acts to only lower data voltage (Vp) when gate voltage is changed from on-voltage to off-voltage. In this case, a lowering degree is referred to as kickback voltage (ΔVp).

Therefore, as the drain electrode has a larger area, parasitic capacitance between the gate electrode and the drain electrode increases, and thus kickback voltage (ΔVp) becomes higher. The high kickback voltage affects the first and second electrodes in a pixel, thereby increasing voltage ripple, such that image sticking occurs on a screen and, thus, resolution is lowered.

Accordingly, there is a demand for a structure that reduces an area of a thin film transistor and lowers parasitic capacitance between a gate electrode and a drain electrode.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding effective filing dates of subject matter disclosed herein.

SUMMARY OF THE INVENTION

Aspects of embodiments of the inventive concept are directed toward a thin film transistor array panel which is structured to decrease an area of a thin film transistor and lower parasitic capacitance between a gate electrode and a drain electrode.

According to an embodiment of the inventive concept, a thin film transistor array panel includes: a substrate; a gate line disposed on the substrate and including a gate electrode; a gate insulating layer on the gate line; a semiconductive island on the gate insulating layer; a circular drain electrode on the semiconductive island; a source electrode disposed on the semiconductive island and shaped like a circular band bent in a direction in which the drain electrode is disposed; a protective layer disposed on the drain and source electrodes and having a contact hole through which the drain electrode is partially exposed; and a pixel electrode electrically coupled to the drain electrode through the contact hole. The gate electrode may include a circular portion that is overlapped by the drain electrode and a circular sector portion that is overlapped by the source electrode. The contact hole may be defined in a region of the protective layer that overlaps the circular portion so as to expose the drain electrode.

The source and drain electrodes may overlap the gate electrode.

An opening may be defined in the circular portion.

The opening may be circular.

The circular portion may overlap the drain electrode and the pixel electrode.

A bent surface of the source electrode, which faces the drain electrode, may be shaped like a circle that is curved inwards.

There may exist a diameter ratio in a range of 2:1 to 3:1 between the drain electrode and the contact hole.

The drain and source electrodes may have a channel of which a length is in a range of 4.3 μm to 4.5 μm.

The drain and source electrodes may have a channel of which a width is in a range of 8.3 μm to 12.7 μm.

The contact hole may have a diameter in a range of 4.9 μm to 5.1 μm.

The drain electrode may have a diameter in a range of 9.8 μm to 15.3 μm.

A length from an end portion of the circular portion of the gate electrode to an end portion of the circular sector portion may be in a range of 21.7 μm to 27.1 μm.

The pixel electrode may have a protrusion defined in the contact hole and in contact with the drain electrode, and the circular portion may overlap the drain electrode and the protrusion.

According to an embodiment of the inventive concept, a thin film transistor array panel includes: a substrate; a gate line disposed on the substrate and including a gate electrode; a gate insulating layer on the gate line; a semiconductive island on the gate insulating layer; a circular drain electrode on the semiconductive island; a source electrode disposed on the semiconductive island and shaped like a circular band bent in a direction in which the drain electrode is disposed; a first protective layer disposed on the drain and source electrodes and having a contact hole through which the drain electrode is partially exposed; a first electrode electrically coupled to the drain electrode through the contact hole; a second protective layer on the first electrode; and a second electrode on the second protective layer. The gate electrode may include a circular portion that is overlapped by the drain electrode and a circular sector portion that is overlapped by the source electrode. The contact hole may be defined in a region of the first protective layer that overlaps the circular portion so as to expose the drain electrode.

There may exist a diameter ratio in a range of 2:1 to 3:1 between the drain electrode and the contact hole.

The drain and source electrodes may have a channel of which a length is in a range of 4.3 µm to 4.5 µm.

The drain and source electrodes may have a channel of which a width is in a range of 10.5 µm to 16.1 µm.

The contact hole may have a diameter in a range of 5.9 µm to 6.1 µm.

The drain electrode may have a diameter in a range of 11.8 µm to 18.3 µm.

A length from an end portion of the circular portion of the gate electrode to an end portion of the circular sector portion may be in a range of 23.7 µm to 30.1 µm.

According to embodiments of the inventive concept, a thin film transistor array panel is capable of decreasing an entire area of a thin film transistor, thereby increasing an aperture ratio and achieving high resolution performance.

Further, according to embodiments of the inventive concept, a thin film transistor array panel is capable of decreasing kickback voltage, thereby reducing voltage ripple and image sticking and thus achieving high resolution performance.

The foregoing summary is illustrative only and is not intended to be in any way limiting the claims of the inventive concept. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
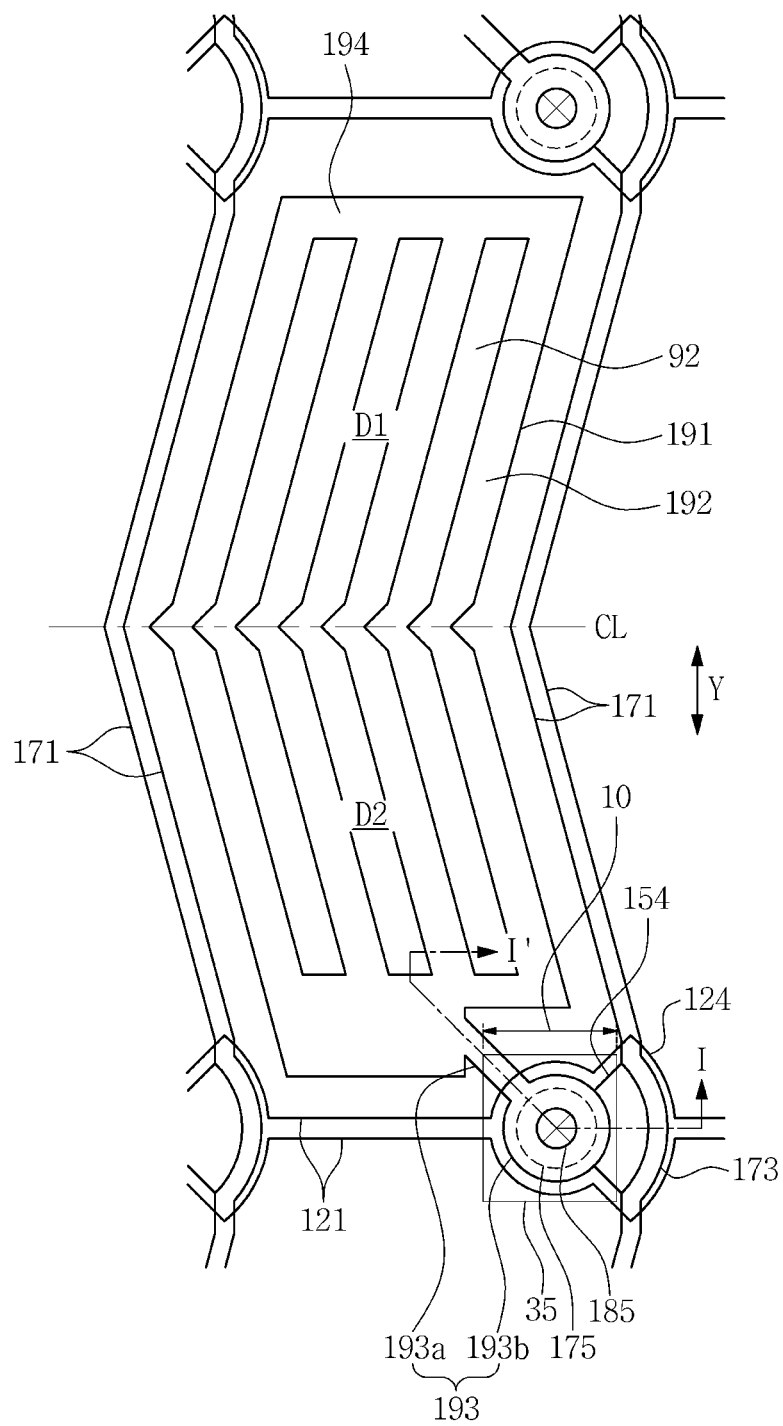
FIG. 1 is a schematic plan view illustrating a display device according to a first embodiment of the inventive concept.

Advantages and features of structures formed in accordance with the present disclosure of the inventive concept and methods for achieving them will be made clear from embodiments described below in more detail with reference to the accompanying drawings. The present teachings may, however, be embodied in many different forms and should not be construed as being limited to the specific embodiments set forth herein. Rather, these embodiments are provided so that this disclosure will be thorough and complete, and will fully convey the scope of the present teachings to those skilled in the pertinent art. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terminology used herein is for the purpose of describing particular embodiments only and is not construed as limiting the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of mentioned component, step, operation and/or element, but do not exclude the presence or addition of one or more other components, steps, operations and/or elements.

Unless otherwise defined, all terms used herein (including technical and scientific terms) have the same meaning as commonly understood by those skilled in the art to which this disclosure of the inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

A display device including a thin film transistor array panel according to a first embodiment of the inventive concept may be a liquid crystal display (LCD). The LCD according to the first embodiment uses a plane to line switching (PLS) mode. In addition, the display device may be an organic light emitting diode (OLED) display or the like, which includes a thin film transistor (TFT) structure according to an embodiment of the inventive concept.

Figure 2:
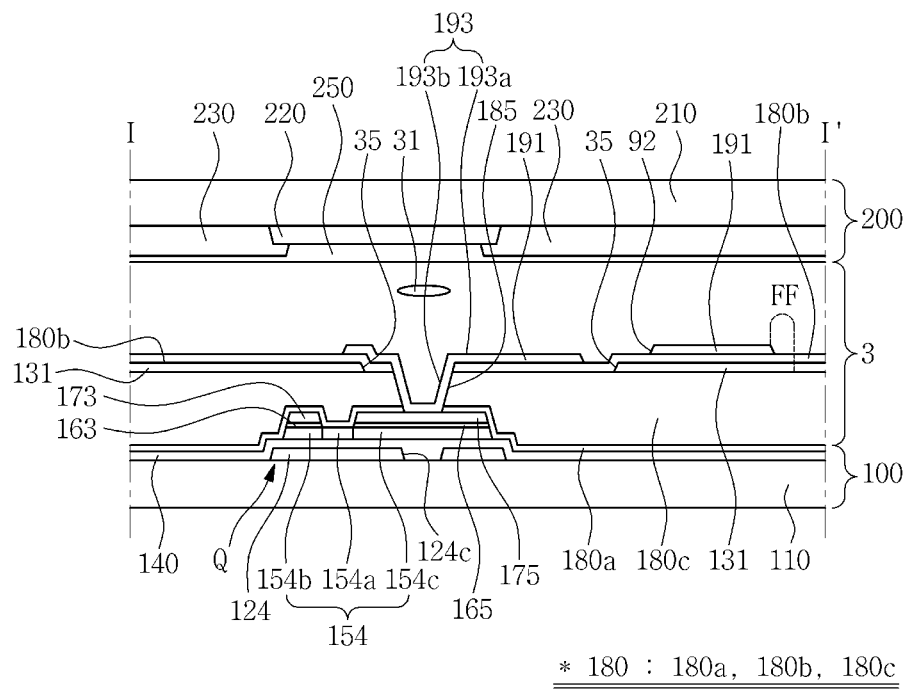
FIG. 2 is a cross-sectional view taken along line I-I' of FIG. 1.

FIG. 1 is a schematic plan view illustrating a display device according to a first embodiment of the inventive concept; and FIG. 2 is a cross-sectional view taken along line I-I' of FIG. 1

Referring to FIGS. 1 and 2, and in particular to FIG. 2 initially, the LCD according to the first embodiment includes lower and upper array panels 100 and 200 that face (or oppose) each other and also includes a liquid crystal layer 30 interposed between the lower and upper array panels 100 and 200.

First, the upper array panel 200 will be described as follows.

A light blocking member 220 and a color filter 230 may be disposed on a substrate 210 including transparent glass or plastic. The light blocking member 220 is also called a black matrix and may be configured to prevent or reduce light leakage between pixels PX. The color filter 230 may display one of three primary colors, i.e., red, green, and blue. At least one of the light blocking member 220 and the color filter 230 may be disposed on the lower array panel 100.

An overcoat layer 250 may be disposed on the color filter 230 and the light blocking member 220.

The liquid crystal layer 30 may include a liquid crystal molecule 31 that has dielectric anisotropy. When no electric field is applied to the liquid crystal layer 30 (in the absence of an electric field), a long axis of the liquid crystal molecule 31 may be disposed parallel to the array panels 100 and 200, and the liquid crystal molecule 31 may have positive dielectric anisotropy. The liquid crystal molecule 31 may be a nematic liquid crystal molecule of which the long axis twists in a helical structure from the lower array panel 100 to the upper array panel 200.

Next, the lower array panel 100 will be described as follows. The lower array panel 100 may correspond to a thin film transistor (TFT) array panel.

A gate conductor including a plurality of gate lines 121 (FIG. 1) may be disposed (not shown in FIG. 2) on a substrate 110 including transparent glass or plastic. The plurality of gate lines 121 may be disposed on the substrate 110 along a first direction. The first direction may be horizontal. That is, the plurality of gate lines 121 may transmit gate signals and may generally extend in a horizontal direction. Each gate line 121 may include a plurality of gate electrodes 124.

A gate insulating layer 140 may be disposed on the gate line 121. The gate insulating layer 140 may include an inorganic insulating material such as silicon nitride (SiNx) or silicon oxide (SiOx).

A semiconductive island 154 may be disposed on the gate insulating layer 140. The semiconductive island 154 may include amorphous silicon or polysilicon, or may include a semiconductive oxide (oxide semiconductor). The semiconductive oxide may include at least one selected from the group consisting of a zinc (Zn), gallium (Ga), indium (In), and tin (Sn) oxide.

In an exemplary embodiment, the semiconductive oxide may be made of an oxide based on zinc (Zn), gallium (Ga), tin (Sn), or indium (In), or an oxide semiconductor material, such as zinc oxide (ZnO), indium-gallium-zinc oxide (In-GaZnO4), Indium-zinc oxide (In—Zn—O), and zinc-tin oxide (Zn—Sn—O), which are complex oxides.

In more detail, the semiconductive oxide may include an IGZO-based oxide consisting of indium (In), gallium (Ga), zinc (Zn) and oxygen (O). In addition, the semiconductive oxide may include In—Sn—Zn—O-based metal oxide, In—Al—Zn—O-based metal oxide, Sn—Ga—Zn—O-based metal oxide, Al—Ga—Zn—O-based metal oxide, Sn—Al—Zn—O-based metal oxide, In—Zn—O-based metal oxide, Sn—Zn—O-based metal oxide, Al—Zn—O-based metal oxide, In—O-based metal oxide, Sn—O-based metal oxide, and Zn—O-based metal oxide.

The semiconductive island 154 may include a channel area 154a that is insulated from and overlaps the gate electrode 124, a source area 154b electrically coupled to a source electrode 173, and a drain area 154c electrically coupled to a drain electrode 175. Gate electrode 124 includes an opening 124c.

A plurality of ohmic contacts 163 and 165 may be disposed on the semiconductive island 154. The ohmic contacts 163 and 165 may be made of a material such as n+ hydrogenated amorphous silicon which is doped with n-type impurities such as phosphorus (P) at a high concentration, or may be made of silicide. The ohmic contacts 163 and 165 may be disposed in pairs on the semiconductive island 154. Where the semiconductive island 154 is a semiconductive oxide (oxide semiconductor), the ohmic contacts 163 and 165 may be omitted.

A data line 171 (FIG. 1) including the source electrode 173 and a data conductor including the drain electrode 175 may be disposed on the ohmic contacts 163 and 165 and gate insulating layer 140.

The data line 171 may be disposed (not shown in FIG. 2) on the substrate 110 along a second direction and may intersect (or cross) the gate line 121. The second direction may be vertical. That is, the data line 171 may transmit a data signal and may generally extend in a vertical direction.

The data line 171 may be periodically bent to achieve improved transmittance. For instance, as illustrated in FIG. 1, each data line 171 may be bent in a region corresponding to a horizontal central line CL of one pixel PX.

The data line 171 may include the source electrode 173. According to the first exemplary embodiment illustrated in FIG. 1, the source electrode 173 may not protrude from the data line 171, but may be bent from the data line 171.

Figure 4:
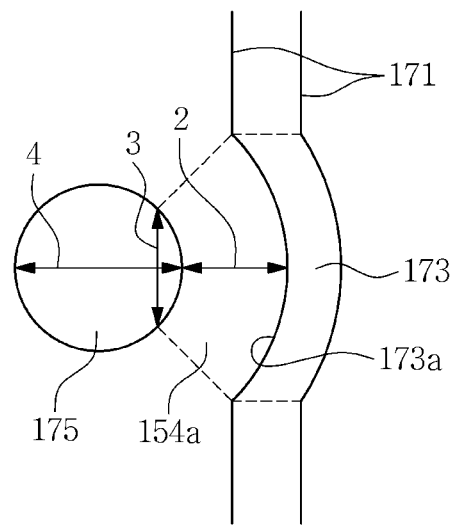
FIG. 4 is a schematic plan view illustrating source and drain electrodes shown in FIG. 1.

The drain electrode 175 may face the source electrode 173 and may be circular in shape, as illustrated in FIGS. 1 and 4.

The gate, source, and drain electrodes 124, 173, and 175 may be included in one TFT (Q), together with the semiconductive island 154. A channel of the TFT may be disposed on the semiconductive island 154 between the source and drain electrodes 173 and 175. The gate, source, and drain electrodes 124, 173, and 175 will be further described later with reference to FIGS. 3 to 5.

Referring again to FIG. 2, a protective layer 180 may be configured to insulate different components, and may be, for example, an insulating layer. The protective layer 180 may include first, second, and third protective layers 180a, 180b, and 180c.

The first protective layer 180a may be disposed on the data conductor (not shown), the gate insulating layer 140, and an exposed portion of the semiconductive island 154.

The first protective layer 180a may include at least one selected from an inorganic insulator such as silicon nitride (SiNx) or silicon oxide (SiOx), an organic insulator, and an insulator having a low dielectric constant.

The third protective layer 180c may be disposed on the first protective layer 180a. The third protective layer 180c may include an organic insulator and may have a smooth (or flat) surface. The third protective layer 180c may have a thickness that varies depending on locations. That is, the third protective layer 180c may be a planarization layer.

The third protective layer 180c may include a color filter (not shown), which is different from the first exemplary embodiment of the inventive concept. The color filter may uniquely display one of the primary colors. Examples of the primary colors include not only red, green, and blue but also yellow, cyan, and magenta.

A second electrode 131 may be disposed on the third protective layer 180c. The second electrode 131 may correspond to a common electrode. Unless otherwise stated, the second electrode 131 may be used as a common electrode in the first exemplary embodiment. The second electrode 131 is a surface type and may be in the form of a plate disposed on the substantially entire surface of the first substrate 110. That is, the second electrodes 131 in a plurality of pixels PX may be coupled to each other, and thus may transmit common voltages Vcom that are equal to each other. However, the second electrode 131 may have a second electrode hole 35, which corresponds to the drain electrode 175. The second electrode hole 35 may have a diameter 10 in a range of 14.6 μm to 14.8 μm.

The second electrode 131 may include a transparent conductive material such as ITO or IZO.

The second protective layer 180b may be disposed on the second electrode 131. The second protective layer 180b may include an inorganic insulator, an organic insulator, or the like. A contact hole 185 may be defined in the first, second, and third protective layers 180a, 180b and 180c, and the drain electrode 175 may be exposed through the contact hole 185. The contact hole 185 may be defined within the second electrode hole 35. That is, the second electrode hole 35 may surround the contact hole 185.

Referring further to FIGS. 1 and 2, a first electrode 191 may be disposed, as shown in FIG. 2, on the second protective layer 180b. The first electrode 191 may correspond to a pixel electrode. Unless otherwise stated, the first electrode 191 may be used as a pixel electrode in the first exemplary embodiment. The first electrode 191 may include a plurality of branch electrodes 192 (FIG. 1) that overlap the second electrode 131, a connector 194 (FIG. 1) configured to couple end portions of the plurality of branch electrodes 192, and a protrusion 193 (FIG. 1) configured for connection to other layers. A slit 92 (FIG. 1), from which an electrode is removed, may be disposed between the plurality of branch electrodes 192 that are adjacent to the first electrode 191.

As shown in FIG. 1, the plurality of branch electrodes 192 of the first electrode 191 may extend substantially parallel to the data lines 171. The plurality of branch electrodes 192 of the first electrode 191 may be inclined at an oblique angle with respect to a vertical direction (Y) and may be bent at the horizontal central line CL. Accordingly, the first electrode 191 may be divided into first and second domains D1 and D2 in which the plurality of branch electrodes 192 are inclined in different directions with respect to the horizontal central line CL of the pixel PX.

The connector 194 of the first electrode 191 may couple end portions of the plurality of branch electrodes 192 toward a side where the TFT (Q) is disposed or couple end portions of the plurality of branch electrodes 192 opposite thereto. The connector 194 may have a larger width than the branch electrode 192.

The protrusion 193 of the first electrode 191 may be physically and electrically coupled to the drain electrode 175 through the contact hole 185 defined in the first, second, and third protective layers 180a, 180b, and 180c. The protrusion 193 of the first electrode 191 may receive voltage from the drain electrode 175.

The first electrode 191 may include a transparent conductive material such as ITO or IZO.

An alignment layer (not shown) may be coated on at least one interior surface of the two array panels 100 and 200 of FIG. 2. The alignment layer may be a horizontal alignment layer. The alignment layer may be rubbed or photoaligned in a predetermined direction, e.g. the vertical direction (Y). Therefore, the liquid crystal molecule 31 of the liquid crystal layer 30 may be initially aligned in a direction substantially parallel to the vertical direction (Y).

Although not illustrated, at least one touch sensor (not shown) may be disposed on at least one of the two array panels 100 and 200 so as to detect touch. The touch sensor may be divided into various types: a resistive type, a capacitive type, an electromagnetic type, and an optical type. Further, the touch sensor may be disposed on any one of the two array panels 100 and 200, or may be attached to the array panels 100 and 200 in the form of a touch panel.

The first electrode 191 receiving data voltage from the TFT (Q) and the second electrode 131 receiving common voltage Vcom may be electric field generating electrodes, and thus both may generate an electric field in the liquid crystal layer 30, thereby determining an orientation of the liquid crystal molecule 31 of the liquid crystal layer 30 and displaying an image. The plurality of branch electrodes 192 of the first electrode 191 may generate a fringe field (FF) in the liquid crystal layer 30, together with the second electrode 131, as illustrated in FIG. 2, thereby determining an orientation of the liquid crystal molecule 31. The first electrode 191 may include a plurality of domains D1 and D2 in which the plurality of branch electrodes 192 are inclined in different directions, and thus the liquid crystal molecule 31 may also be tilted in many different directions so that a reference viewing angle of an LCD may increase.

Meanwhile, a traditional drain electrode may include a bar-type portion that faces the source electrode 173 and extends substantially parallel to the source electrode 173, and also include an enlargement portion at an opposite side thereof. The bar-type portion may overlap the semiconductive island 154 and the enlargement portion may be in contact with the first electrode 191. Therefore, an aperture ratio may be reduced because the traditional drain electrode is divided into the bar-type portion and the enlargement portion. Further, in the case of a plane to line switching (PLS) mode LCD as in the first exemplary embodiment, the second protective layer 180b may be further included to insulate the first electrode 191 from the second electrode 131, and thus the contact hole 185 may be larger. As the contact hole 185 through which the drain electrode 175 is exposed becomes larger, the enlargement portion of the drain electrode 175, which is in contact with the first electrode 191, may also increase, and this may result in reduction in an aperture ratio.

According to one or more exemplary embodiment, the contact hole 185 through which the drain electrode 175 is exposed, the bar-type portion and enlargement portion of the drain electrode 175 may be disposed in the same region. The TFT (Q) will be described below in detail with reference to FIGS. 3 to 5.

Figure 3:
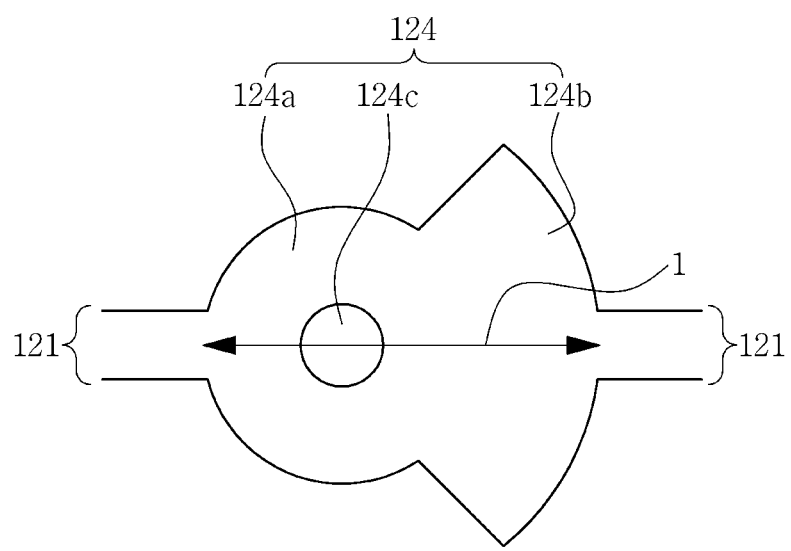
FIG. 3 is a schematic plan view illustrating a gate electrode shown in FIG. 1.
Figure 5:
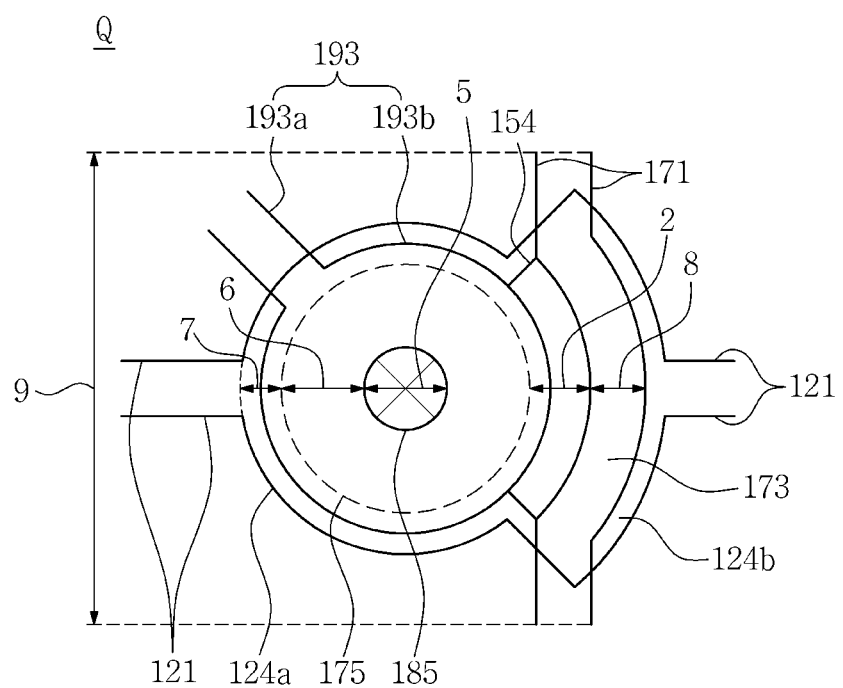
FIG. 5 is a schematic plan view illustrating a thin film transistor shown in FIG. 1.

FIG. 3 is a schematic plan view illustrating the gate electrode shown in FIG. 1. FIG. 4 is a schematic plan view illustrating the source and drain electrodes shown in FIG. 1. FIG. 5 is a schematic plan view illustrating the TFT shown in FIG. 1.

Referring to FIGS. 2 to 5, the TFT (Q) may include the gate electrode 124 (FIG. 3) on the substrate 110 (FIG. 2), the semiconductive island 154 on the gate insulating layer 140, the circular drain electrode 175 on the semiconductive island 154 (FIG. 5), and the source electrode 173 (FIG. 4) on the semiconductive island 154 (FIG. 5).

The gate electrode 124 may include, as shown in FIGS. 3 and 5, a circular portion 124a that is overlapped by the drain electrode 175 and a circular sector portion 124b that is overlapped by the source electrode 173. An opening 124c may be defined in the circular portion 124a of the gate electrode 124. The opening 124c may be circular in shape. The gate electrode 124, as illustrated in FIG. 3, may be coupled between the plurality of gate lines 121. For instance, the gate lines 121 may be disposed substantially collinear with a central portion of the gate electrode 124.

The circular portion 124a of the gate electrode 124 may be overlapped by the drain electrode 175 and the first electrode 191.

The source electrode 173, as shown in FIG. 4, may be shaped like a circular band. A bent surface 173a of the source electrode 173, which faces the drain electrode 175, may be shaped like a circle that is curved inwards (i.e., a concave surface). The channel area 154a of the semiconductive island 154 (FIGS. 2 and 5) may be disposed between the source electrode 173 and the drain electrode 175. The bent surface 173a of the source electrode 173 may be spaced apart from the drain electrode 175 by a predetermined distance. That is, the circular drain electrode 175 may face the bent surface 173a of the source electrode 173, and thus a channel length (2) of channel area 154a may remain the same.

The drain electrode 175 may be shaped like a circle. The source and drain electrodes 173 and 175 may overlap the gate electrode 124.

Meanwhile, as shown in FIG. 5, the protective layer 180 (FIG. 2) may have the contact hole 185 through which the drain electrode 175 is exposed in a region that overlaps the circular portion 124a and the opening 124c (FIG. 3) of the gate electrode 124.

The first electrode 191 (FIG. 2) may be disposed in the contact hole 185 and may include the protrusion 193 (FIG. 1) in contact with the drain electrode 175. The protrusion 193 may include an extension portion 193a (FIGS. 1 and 5) protruding from an end portion of the first electrode 191 and a protruding circular portion 193b (FIGS. 1 and 5) that is coupled to the extension portion 193a and overlaps the drain electrode 175. The protruding circular portion 193b may have an area (FIG. 5) that is substantially the same as or larger than that of the drain electrode 175.

Referring to FIGS. 3 to 5, in a plane to line switching (PLS) mode LCD, a gate length (1) (FIG. 3) between an end portion of the circular portion 124a and an end portion of the circular sector portion 124b may be in a range of 23.7 µm to 30.1 µm. The channel length (2) (FIGS. 4 and 5) between the drain electrode 175 and the source electrode 173 may be in a range of 4.3 µm to 4.5 µm. A channel width (3) (FIG. 4) between the drain and source electrodes 175 and 173 may be in a range of 10.5 µm to 16.1 µm. The drain electrode 175 may have a diameter (4) (FIG. 4) in a range of 11.8 µm to 18.3 µm. The contact hole 185 may have a diameter (5) (FIG. 5) in a range of 5.9 µm to 6.1 µm. The ratio of the diameter (5) of the contact hole 185 to the diameter (4) of the drain electrode 175 may be in a range of 1:2 to 1:3. A non-display area in which the TFT (Q) is disposed may have a length (9) in a range of 24.3 µm to 24.6 µm.

In an exemplary embodiment, for instance, the length (1) between an end portion of the circular portion 124a and an end portion of the circular sector portion 124b may be about 30 µm, the channel length (2) between the drain and source electrodes 175 and 173 may be about 4.4 µm, the channel width (3) between the drain and source electrodes 175 and 173 may be about 16 µm, the diameter (4) of the drain electrode 175 may be about 18 µm, and the diameter (5) of the contact hole 185 may be about 6 µm.

Meanwhile, a length (6) (FIG. 5) between an end portion of the contact hole 185 and an end portion of the drain electrode 175 may be about 6 µm, a length (7) (FIG. 5) between an end portion of the drain electrode 175 and an end portion of the circular portion 124a may be about 3 µm, and the source electrode 173 may have a width (8) (FIG. 5) of about 4 µm.

In such a structure of the TFT (Q), the circular portion 124a of the gate electrode 124 may be overlapped by the circular drain electrode 175 and the protrusion 193 of the first electrode 191. Therefore, unlike a conventional way, a part where the gate electrode 124 is overlapped by the drain electrode 175 may be located in the same region as the contact hole 185, and thus the TFT (Q) may have a smaller area. As the entire area of the TFT (Q) becomes smaller, an aperture ratio may increase and thus high resolution may be achieved.

Further, the circular portion 124a of the gate electrode 124 may have the opening 124c, parasitic capacitance between the gate electrode 124 and the drain electrode 175 may be lowered. The lowered parasitic capacitance between the gate electrode 124 and the drain electrode 175 may lead to decrease in kickback voltage, thereby reducing or effectively preventing voltage ripple and image sticking and thus achieving high resolution performance.

Figure 6:
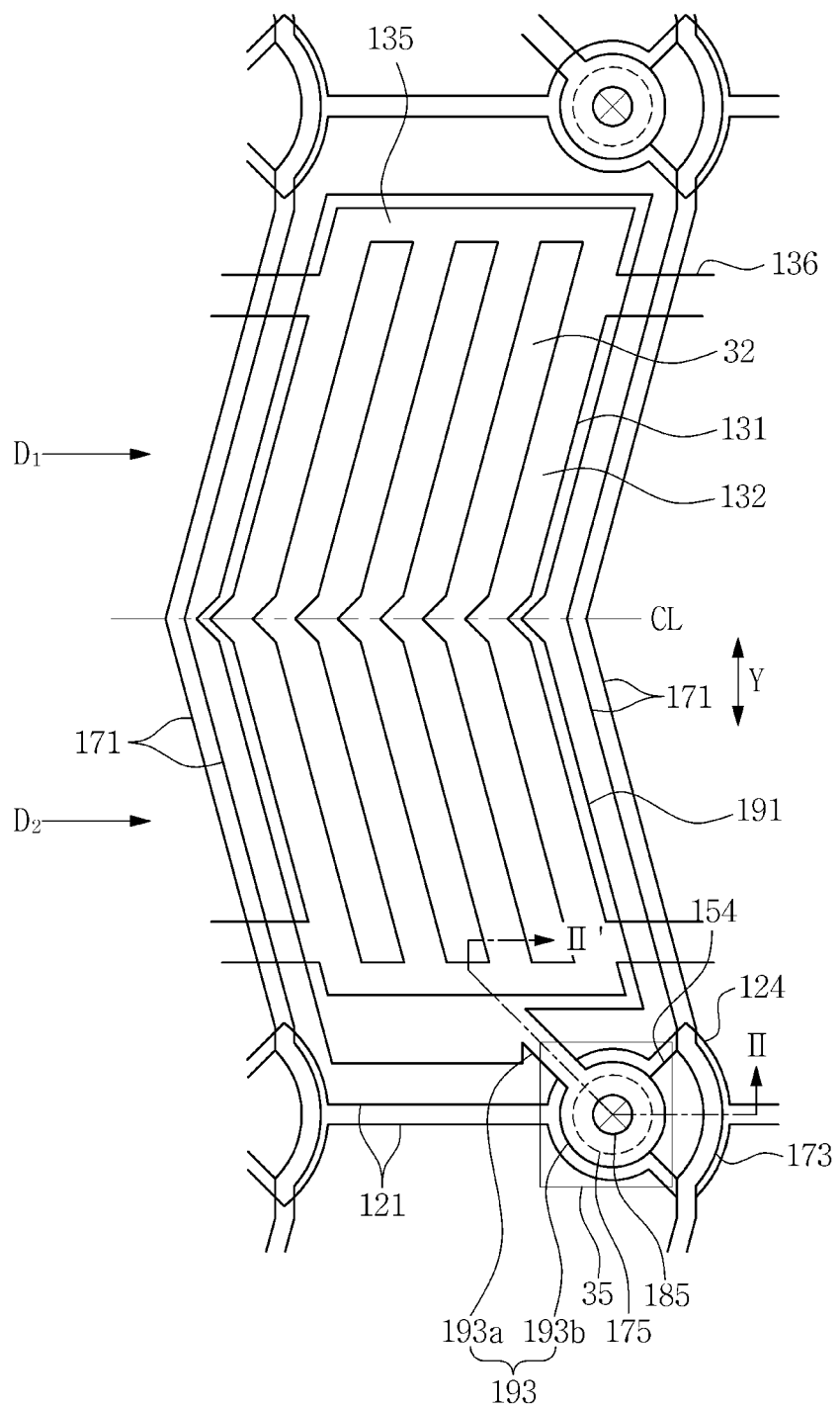
FIG. 6 is a schematic plan view illustrating a display device according to a second embodiment of the inventive concept.
Figure 7:
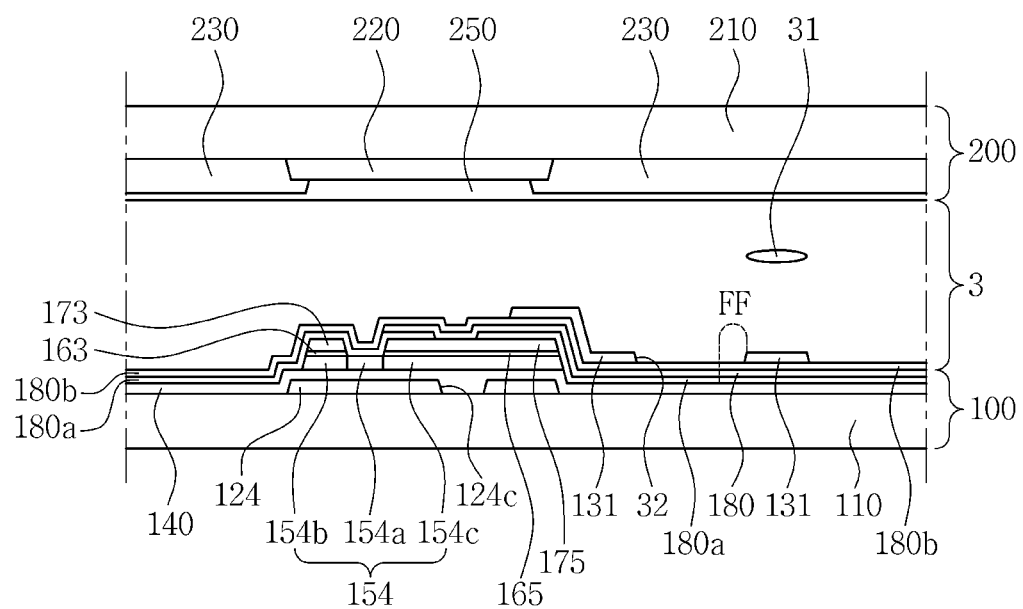
FIG. 7 is a cross-sectional view taken along line II-IF of FIG. 6.

Hereinafter, a second exemplary embodiment will be provided with reference to FIGS. 6 and 7. FIG. 6 is a schematic plan view illustrating a display device according to the second exemplary embodiment of the inventive concept. FIG. 7 is a cross-sectional view taken along line II-II' of FIG. 6.

The second exemplary embodiment is almost similar to the first exemplary embodiment in terms of configuration, but there is a difference in a position where the first and second electrodes 191 and 131 are laminated. For ease of description, the second exemplary embodiment will be provided herein based on the difference between the two exemplary embodiments.

Referring to FIGS. 6 and 7, the first electrode 191 may be directly disposed on the drain electrode 175. The first electrode 191 may correspond to a pixel electrode. The first electrode 191 may be in direct contact with the drain electrode 175. The first electrode 191 may be a surface type, e.g., in the form of a plate and may be disposed in a pixel PX, which is different from the first exemplary embodiment.

The first protective layer 180a may be disposed between a data conductor (not shown) and the first electrode 191.

The second protective layer 180b may be disposed on the first protective layer 180a and the first electrode 191.

The second electrode 131 may be disposed on the second protective layer 180b. The second electrode 131 may correspond to a common electrode. The second electrodes 131 in a plurality of pixels PX may be coupled to each other utilizing a connecting bridge 136, or the like, so as to transmit common voltages Vcom that are equal to each other. According to the second exemplary embodiment, the second electrode 131 includes a plurality of branch portions 132 that overlap the surface-type first electrode 191 and also includes a branch connector 135 configured to couple end portions of the plurality of branch portions 132. A cut-out portion 32, from which an electrode is removed, may be disposed between the plurality of branch portions 132 that are adjacent to the second electrode 131.

The second electrode 131 may have substantially the same shape as the first electrode 191 according to the first exemplary embodiment illustrated in FIG. 1, and thus further description of the shape of the second electrode 131 will not be provided herein.

The first electrode 191 receiving data voltage from the TFT (Q) and the second electrode 131 receiving common voltage Vcom may be electric field generating electrodes, and thus both may generate an electric field in the liquid crystal layer 30, thereby determining an orientation of the liquid crystal molecule 31 of the liquid crystal layer 30 and displaying an image. The plurality of branch portions 132 of the second electrode 131 may generate a fringe field (FF) in the liquid crystal layer 30, together with the second electrode 131, thereby determining an orientation of the liquid crystal molecule 31. A plurality of domains D1 and D2 in which the plurality of branch portions 132 of the second electrode 131 in a pixel PX are inclined in different directions may be formed, and thus the liquid crystal molecule 31 may also be tilted in many different directions so that a reference viewing angle of an LCD may increase.

Hereinafter, a third exemplary embodiment of the inventive concept will be provided with reference to FIG. 8. The third exemplary embodiment is almost similar to the first exemplary embodiment in terms of configuration. For ease of description, the third exemplary embodiment will be provided herein based on differences between the two exemplary embodiments.

Figure 8:
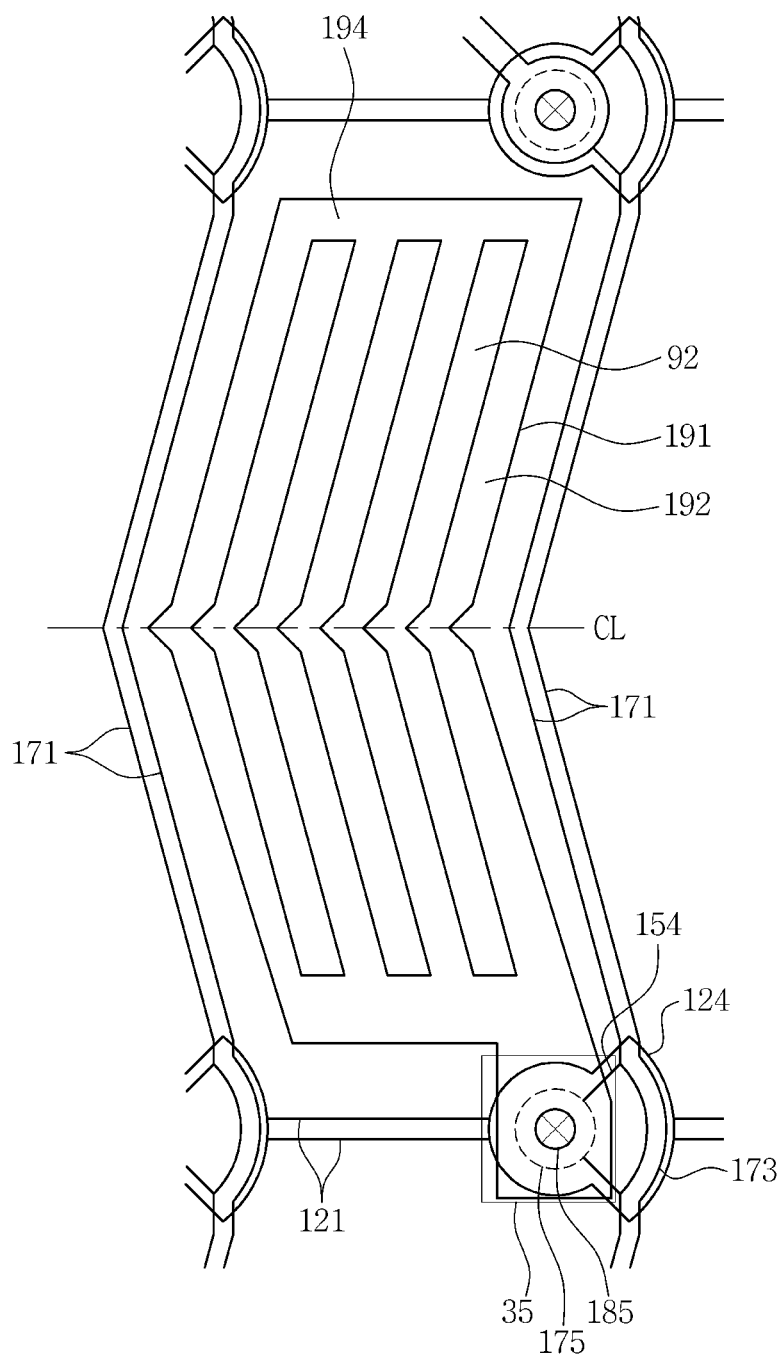
FIG. 8 is a schematic plan view illustrating a display device according to a third embodiment of the inventive concept.

FIG. 8 is a schematic plan view illustrating a display device according to the third exemplary embodiment of the inventive concept.

Referring to FIG. 8, the protrusion 193 of the first electrode 191 may be shaped like a quadrilateral, not a circle. In view of process efficiency of a TFT array panel, the protrusion 193 of the first electrode 191 may be formed as in the first exemplary embodiment or may also be formed as in the third exemplary embodiment.

Hereinafter, a fourth exemplary embodiment of the inventive concept will be described with reference to FIG. 9. The fourth exemplary embodiment is almost similar to the first exemplary embodiment in terms of configuration, but there is a difference in a shape of the first electrode 191. For ease of description, the fourth exemplary embodiment will be described herein based on the difference between the two exemplary embodiments.

Figure 9:
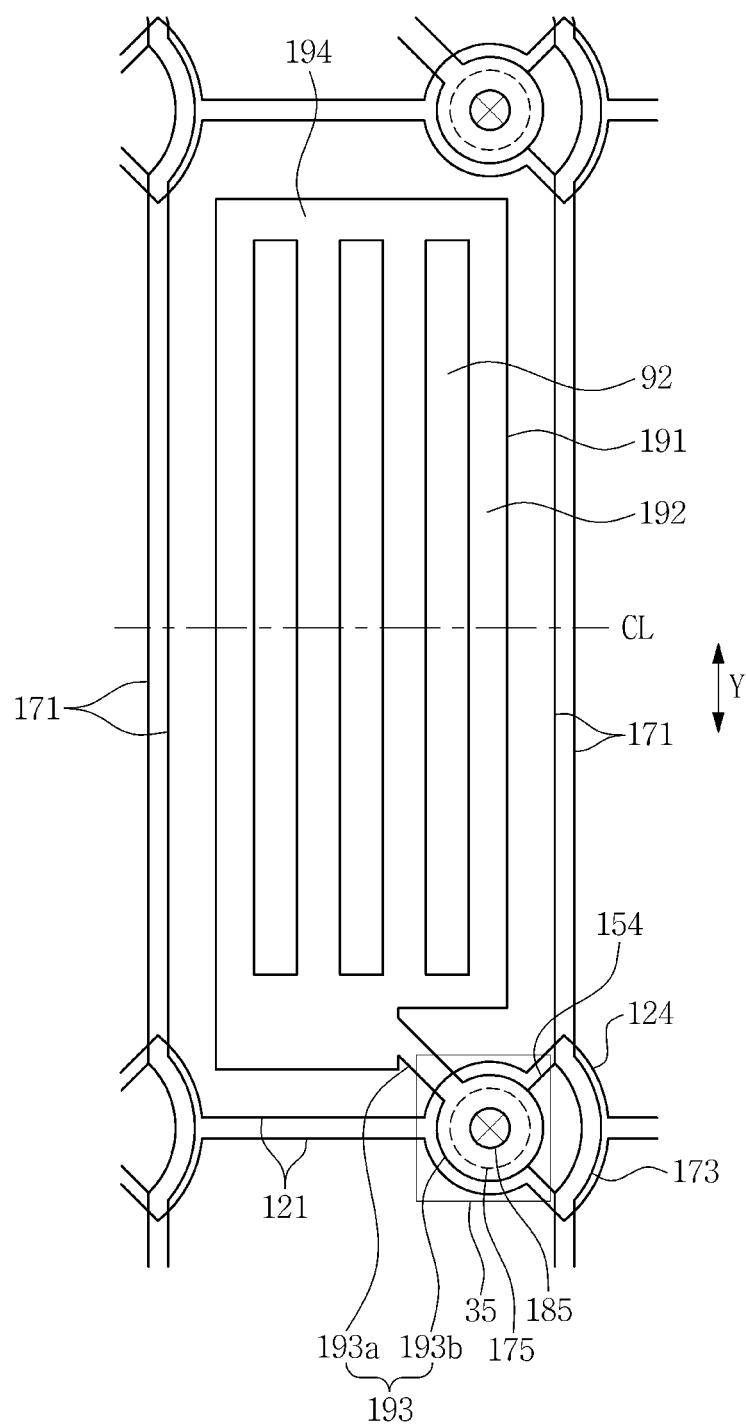
FIG. 9 is a schematic plan view illustrating a display device according to a fourth embodiment of the inventive concept.

FIG. 9 is a schematic plan view illustrating a display device according to the fourth embodiment of the inventive concept.

Referring to FIG. 9, the plurality of branch electrodes 192 of the first electrode 191, the slit 92, and the data line 171 may not be inclined at an oblique angle with respect to the vertical direction (Y) but may be disposed in a straight manner. In view of manufacturing costs and process efficiency, the first electrode 191 may be shaped (or formed) as in the first or fourth exemplary embodiment.

Hereinafter, a fifth exemplary embodiment of the inventive concept will be described with reference to FIGS. 10 and 11. The fifth exemplary embodiment is almost similar to the first exemplary embodiment in terms of configuration, but there are differences in a shape of the first electrode 191 and a position where the second electrode 131 is laminated. For ease of description, the fifth exemplary embodiment will be described herein based on the differences between the two exemplary embodiments. Meanwhile, the fifth exemplary embodiment relates to a twisted nematic (TN) mode LCD, which is different from the first exemplary embodiment.

Figure 10:
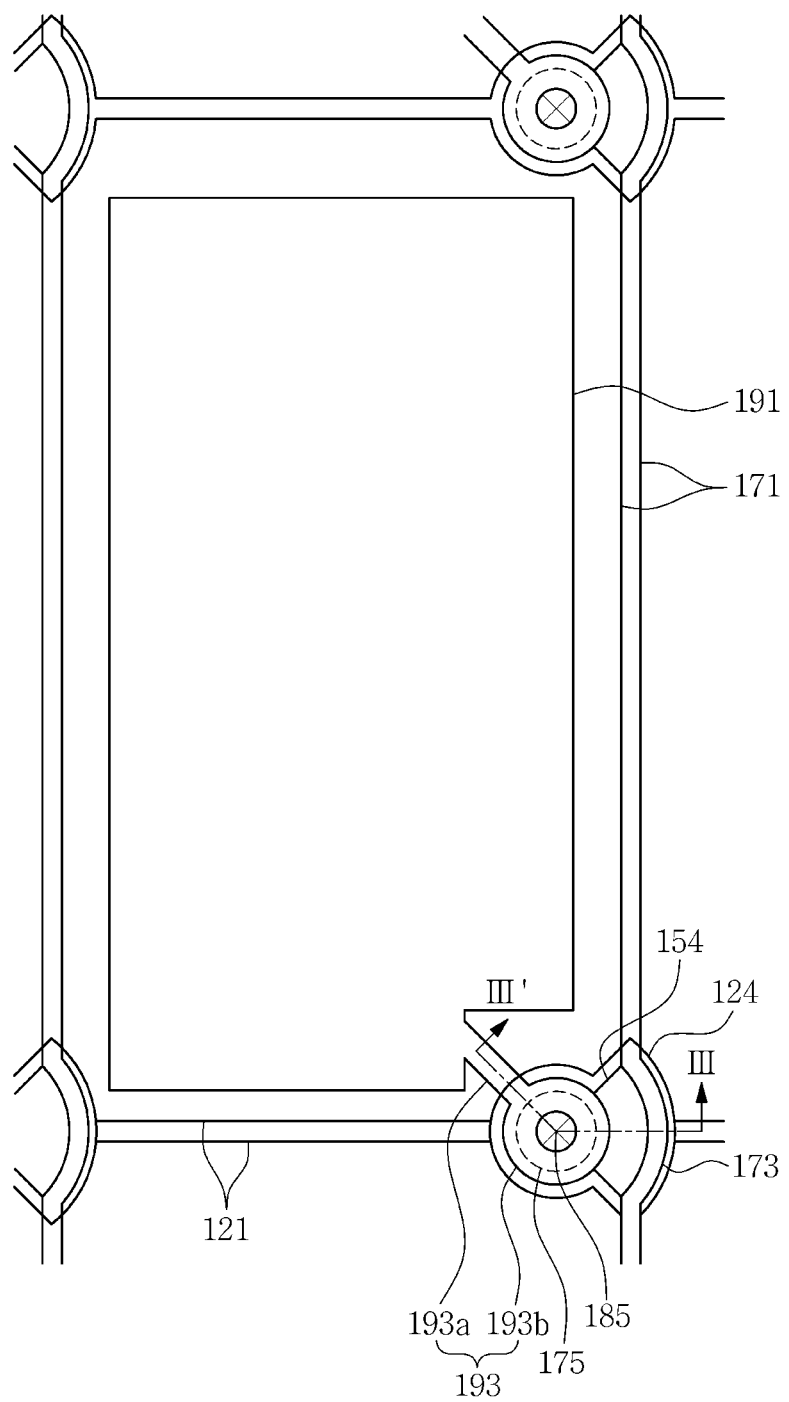
FIG. 10 is a schematic plan view illustrating a display device according to a fifth embodiment of the inventive concept.

FIG. 10 is a schematic plan view illustrating a display device according to the fifth exemplary embodiment of the inventive concept. FIG. 11 is a cross-sectional view taken along line III-III' of FIG. 10.

Figure 11:
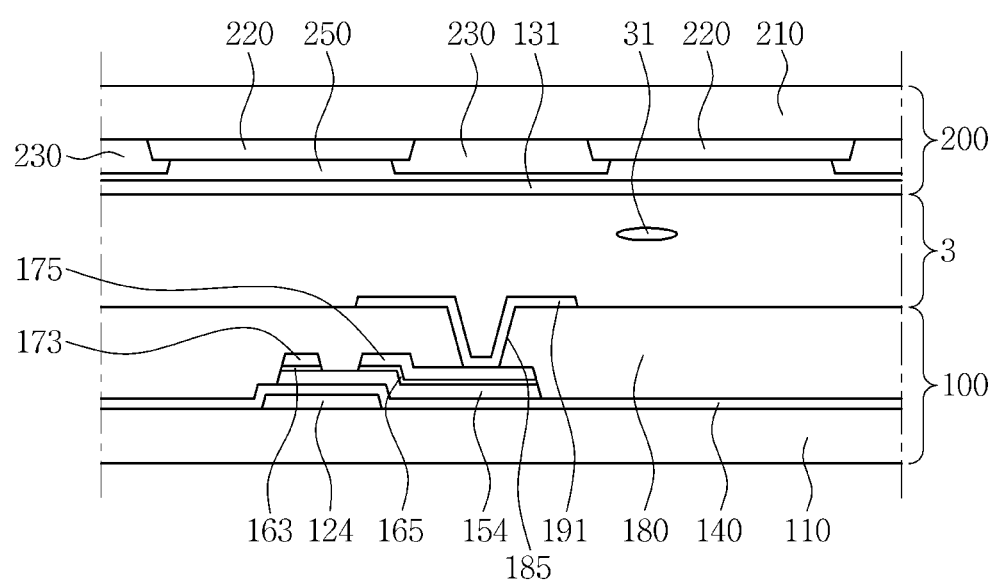
FIG. 11 is a cross-sectional view taken along line III-III' of FIG. 10.

Referring to FIGS. 10 and 11, the protective layer 180 may be disposed between a data conductor (not shown) and the first electrode 191. The first electrode 191 may be disposed on the protective layer 180. The first electrode 191 may correspond to a pixel electrode. The first electrode 191 may be electrically coupled to the drain electrode 175 through the contact hole 185 defined in the protective layer 180. The first electrode 191 may be a surface type, e.g., in the form of a plate (FIG. 10), and may be disposed in a pixel PX, which is different from the previously described exemplary embodiments.

The second electrode 131 may be disposed on the overcoat layer 250 on the substrate 210. The second electrode 131 may correspond to a common electrode. The first electrode 191 may be physically and electrically coupled to the drain electrode 175 through the contact hole 185 and may receive data voltage from the drain electrode 175. The first electrode 191 receiving the data voltage may generate an electric field, in conjunction with the second electrode 131 on the second substrate 210 receiving common voltage, thereby determining an orientation of the liquid crystal molecule 31 of the liquid crystal layer 30 between the two electrodes 191 and 131. Polarization of light passing through the liquid crystal layer 30 may change in accordance with the orientation of the liquid crystal molecule 31.

Meanwhile, according to the fifth exemplary embodiment relating to the twisted nematic (TN) mode LCD, the insulating layer may not be disposed between the first and second electrodes 191 and 131 as in the plane to line switching (PLS) mode LCD. For this reason, there may be a difference in a length range, e.g., a diameter, of the drain electrode 175, between the fifth and first exemplary embodiments. The length range of each component of the TFT will be described below with reference to FIGS. 3 to 5.

Referring to FIGS. 3 to 5, in the twisted nematic (TN) mode LCD, a length (1) between an end portion of the circular portion 124a and an end portion of the circular sector portion 124b may be in a range of 21.7 µm to 27.1 µm. A channel length (2) between the drain electrode 175 and the source electrode 173 may be in a range of 4.3 µm to 4.5 µm. A channel width (3) between the drain and source electrodes 175 and 173 may be in a range of 8.4 µm to 12.6 µm. The drain electrode 175 may have a diameter (4) in a range of 9.8 µm to 15.3 µm. The contact hole 185 may have a diameter (5) in a range of 4.9 µm to 5.1 µm. The ratio of the diameter (5) of the contact hole 185 to the diameter (4) of the drain electrode 175 may be in a range of 1:2 to 1:3. A non-display area in which the TFT (Q) is disposed may have a length (9) in a range of 24.3 µm to 24.6 µm.

In an exemplary embodiment, for instance, the length (1) between an end portion of the circular portion 124a and an end portion of the circular sector portion 124b may be about 27 µm, the channel length (2) between the drain and source electrodes 175 and 173 may be about 4.4 µm, the channel width (3) between the drain and source electrodes 175 and 173 may be about 12.6 µm, the diameter (4) of the drain electrode 175 may be about 15 µm, and the diameter (5) of the contact hole 185 may be about 5 µm.

Meanwhile, a length (6) between an end portion of the contact hole 185 and an end portion of the drain electrode 175 may be about 6 µm, a length (7) between an end portion of the drain electrode 175 and an end portion of the circular portion 124a may be about 3 µm, and the source electrode 173 may have a width (8) of about 4 µm.

From the foregoing, it will be appreciated that various embodiments of the inventive concept have been described herein for purposes of illustration, and that various modifications may be made without departing from the scope and spirit of the present disclosure. Accordingly, the various embodiments disclosed herein are not intended to limit the scope of the inventive concept, and the true scope and spirit of the inventive concept is indicated by the following claims, and equivalents thereof.

What is claimed is:

1. A thin film transistor array panel comprising:
   a substrate;
   a gate line on the substrate, the gate line comprising a gate electrode;
   a gate insulating layer on the gate line;
   a semiconductive island on the gate insulating layer;
   a circular drain electrode on the semiconductive island;
   a source electrode on the semiconductive island, the source electrode being shaped like a circular band bent in a direction from which the drain electrode is disposed;
   a protective layer on the drain and source electrodes, the protective layer having a contact hole through which the drain electrode is partially exposed; and
   a pixel electrode electrically coupled to the drain electrode through the contact hole,
   wherein the gate electrode comprises a circular shape that is overlapped by the drain electrode and a circular sector shape extended from the circular shape that is overlapped by the source electrode, and
   wherein the contact hole is defined in a region of the protective layer that overlaps the circular shape so as to expose the drain electrode.

2. The thin film transistor array panel of claim 1, wherein the source and drain electrodes overlap the gate electrode.

3. The thin film transistor array panel of claim 1, wherein an opening is defined in the circular shape of the gate electrode.

4. The thin film transistor array panel of claim 3, wherein the opening is circular.

5. The thin film transistor array panel of claim 1, wherein the circular shape of the gate electrode is overlapped by the drain electrode and the pixel electrode.

6. The thin film transistor array panel of claim 1, wherein a bent surface of the source electrode, which faces the drain electrode, is shaped like a circle that is curved inwards.

7. The thin film transistor array panel of claim 1, wherein there exists a diameter ratio in a range of 2:1 to 3:1 between the drain electrode and the contact hole.

8. The thin film transistor array panel of claim 7, wherein the drain and source electrodes have a channel of which a length is in a range of 4.3 µm to 4.5 µm.

9. The thin film transistor array panel of claim 7, wherein the drain and source electrodes have a channel of which a width is in a range of 8.3 µm to 12.7 µm.

10. The thin film transistor array panel of claim 7, wherein the contact hole has a diameter in a range of 4.9 µm to 5.1 µm.

11. The thin film transistor array panel of claim 7, wherein the drain electrode has a diameter in a range of 9.8 µm to 15.3 µm.

12. The thin film transistor array panel of claim 7, wherein a length from an end portion of the circular shape of the gate electrode to an end portion of the circular sector shape of the gate electrode is in a range of 21.7 µm to 27.1 µm.

13. The thin film transistor array panel of claim 1, wherein the pixel electrode has a protrusion defined in the contact hole and in contact with the drain electrode, and wherein the circular shape is overlapped by the drain electrode and the protrusion.

14. A thin film transistor array panel comprising:
   a substrate;
   a gate line on the substrate, the gate line comprising a gate electrode;
   a gate insulating layer on the gate line;
   a semiconductive island on the gate insulating layer;
   a circular drain electrode on the semiconductive island;
   a source electrode on the semiconductive island, the source electrode being shaped like a circular band bent in a direction from which the drain electrode is disposed;
   a first protective layer on the drain and source electrodes, the first protective layer having a contact hole through which the drain electrode is partially exposed;
   a first electrode electrically coupled to the drain electrode through the contact hole;
   a second protective layer on the first electrode; and
   a second electrode on the second protective layer,
   wherein the gate electrode comprises a circular shape that is overlapped by the drain electrode and a circular sector shape that is overlapped by the source electrode, and
   wherein the contact hole is defined in a region of the first protective layer that overlaps the circular shape so as to expose the drain electrode.

15. The thin film transistor array panel of claim 14, wherein there exists a diameter ratio in a range of 2:1 to 3:1 between the drain electrode and the contact hole.

16. The thin film transistor array panel of claim 15, wherein the drain and source electrodes have a channel of which a length is in a range of 4.3 µm to 4.5 µm.

17. The thin film transistor array panel of claim 15, wherein the drain and source electrodes have a channel of which a width is in a range of 10.5 µm to 16.1 µm.

18. The thin film transistor array panel of claim 15, wherein the contact hole has a diameter in a range of 5.9 µm to 6.1 µm.

19. The thin film transistor array panel of claim 15, wherein the drain electrode has a diameter in a range of 11.8 µm. to 18.3 µm.

20. The thin film transistor array panel of claim 15, wherein a length from an end portion of the circular shape of the gate electrode to an end portion of the circular sector shape of the gate electrode is in a range of 23.7 µm. to 30.1 µm.

* * * * *